United States Patent
Uejima

(10) Patent No.: US 9,667,215 B2
(45) Date of Patent: May 30, 2017

(54) HIGH-FREQUENCY SWITCH MODULE

(71) Applicant: Murata Manufacturing Co., Ltd., Nagaokakyo-shi, Kyoto-fu (JP)

(72) Inventor: Takanori Uejima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/796,008

(22) Filed: Jul. 10, 2015

(65) Prior Publication Data
US 2015/0318890 A1     Nov. 5, 2015

Related U.S. Application Data

(63) Continuation of application No. PCT/JP2013/079074, filed on Oct. 28, 2013.

(30) Foreign Application Priority Data

Jan. 11, 2013    (JP) .................................. 2013-003526

(51) Int. Cl.
*H04B 1/44*        (2006.01)
*H04B 1/00*        (2006.01)
(Continued)

(52) U.S. Cl.
CPC .......... *H03H 7/0115* (2013.01); *H03H 7/463* (2013.01); *H04B 1/0057* (2013.01);
(Continued)

(58) Field of Classification Search
CPC ...... H04B 1/04; H04B 1/0053; H04B 1/0057; H04B 1/006; H04B 1/16; H04B 1/40;
(Continued)

(56) References Cited

U.S. PATENT DOCUMENTS 5,914,544 A * 6/1999 Tanaka ...................... H01P 1/15
                                                               333/103
6,704,550 B1    3/2004 Kohama et al.
(Continued)

FOREIGN PATENT DOCUMENTS

CN       1503591 A      6/2004
CN       1661915 A      8/2005
(Continued)

OTHER PUBLICATIONS

Official Communication issued in International Patent Application No. PCT/JP2013/079074, mailed on Jan. 28, 2014.

*Primary Examiner* — Quochien B Vuong
(74) *Attorney, Agent, or Firm* — Keating & Bennett, LLP

(57) ABSTRACT

A high-frequency switch module includes a switch IC, a phase adjustment circuit, and a filter circuit. The phase adjustment circuit, which includes an inductor and capacitors, includes a π-type circuit in which the inductor is connected in series between an individual terminal and the filter circuit. The filter circuit is an LC parallel resonant circuit including a filter inductor and a filter capacitor. A distortion second harmonic signal from the individual terminal of the switch IC is reflected by the filter circuit through the phase adjustment circuit and returns to the switch IC through the phase adjustment circuit. This distortion second harmonic signal, whose phase is adjusted by the phase adjustment circuit, is cancelled out by a distortion second harmonic signal output to a common terminal of the switch IC.

16 Claims, 11 Drawing Sheets

(51) Int. Cl.
  *H03H 7/01* (2006.01)
  *H04B 1/18* (2006.01)
  *H04B 1/04* (2006.01)
  *H03H 7/46* (2006.01)
  *H04B 1/48* (2006.01)
  *H03H 7/21* (2006.01)
  *H03H 7/19* (2006.01)
  *H03H 1/00* (2006.01)

(52) U.S. Cl.
  CPC ............ *H04B 1/0458* (2013.01); *H04B 1/18* (2013.01); *H04B 1/48* (2013.01); *H03H 7/19* (2013.01); *H03H 7/21* (2013.01); *H03H 2001/0085* (2013.01); *H03H 2007/013* (2013.01); *H04B 2001/485* (2013.01)

(58) Field of Classification Search
  CPC . H04B 1/44; H04B 1/48; H04B 1/525; H04B 7/0805; H04B 15/00; H03H 7/38; H03H 7/463; H03H 11/344
  USPC ............... 455/78, 82, 83, 84, 63.1, 67.13
  See application file for complete search history.

(56) References Cited

U.S. PATENT DOCUMENTS

| | | | |
|---|---|---|---|
| 7,206,551 B2* | 4/2007 | Itakura | H01P 1/212 455/83 |
| 7,596,357 B2* | 9/2009 | Nakamata | H04B 1/006 455/78 |
| 2004/0152426 A1 | 8/2004 | Suzuki et al. | |
| 2005/0197095 A1 | 9/2005 | Nakamata et al. | |
| 2010/0091752 A1* | 4/2010 | Kemmochi | H03H 7/09 455/78 |
| 2010/0182097 A1 | 7/2010 | Hayashi et al. | |
| 2013/0141180 A1 | 6/2013 | Uejima | |

FOREIGN PATENT DOCUMENTS

| | | |
|---|---|---|
| JP | 2001-086026 A | 3/2001 |
| JP | 2004-297369 A | 10/2004 |
| JP | 2006-129419 A | 5/2006 |
| WO | 2008/018565 A1 | 2/2008 |
| WO | 2012/014643 A1 | 2/2012 |

* cited by examiner

FUNDAMENTAL HARMONIC $S_{f0}$

FIG. 4

| CIRCUIT CONFIGURATION | SECOND HARMONIC LEVEL [dBm] |
|---|---|
| EXISTING CIRCUIT | −80 |
| EXISTING CIRCUIT WITH DOUBLE-SIZE FET | −83 |
| PRESENT-APPLICATION CIRCUIT | −95 |

Pin:−26[dBm]

SERIES RESONANT FILTER

HIGH-FREQUENCY SWITCH MODULE

BACKGROUND OF THE INVENTION

1. Field of the Invention

The present invention relates to a high-frequency switch module that transmits and receives a plurality of types of high-frequency signals by connecting a common terminal to one of a plurality of individual terminals by using a semiconductor switch.

2. Description of the Related Art

Various types of high-frequency switch modules for transmitting and receiving a plurality of high-frequency signals by using a common antenna have been devised. In such a high-frequency switch module, there is a case in which a switch IC including a common terminal and a plurality of individual terminals is used. The switch IC includes a plurality of field-effect transistors (FETs) and connects the common terminal to one of the individual terminals through the on/off operations of the FETs.

In such a switch IC that uses a semiconductor, harmonic signals due to distortion are generated when a high-power high-frequency signal (transmission signal, for example) is input. Such harmonic signals being transmitted to the outside from the common terminal through an antenna causes various problems such as radio wave interference and the like to be generated. In other words, such harmonic signals due to distortion cause degradation of the out-of-band characteristics of the high-frequency switch module.

Hence, the high-frequency circuit disclosed in Japanese Unexamined Patent Application Publication No. 2001-86026 is provided with an LC series resonator that reflects a harmonic signal generated in the switch IC and output to an individual terminal. The LC series resonator is connected between the ground and a signal transmission line connecting the individual terminal of the switch IC to a transmission circuit. As a result, a harmonic signal output from the individual terminal is reflected at a connection point at which the LC series resonator is connected and returns to the switch IC and is transmitted to the common terminal. At this time, by setting, to a predetermined length, the length between the individual terminal and the connection point at which the LC series resonator is connected in the signal transmission line, a harmonic signal output from the common terminal and a harmonic signal from the individual terminal reflected at the connection point at which the LC series resonator is connected and output to the common terminal are made to have opposite phases. With this configuration, a harmonic signal transmitted from the antenna is suppressed.

However, in the existing high-frequency circuit disclosed in Japanese Unexamined Patent Application Publication No. 2001-86026, the phase of a harmonic signal from an individual terminal is adjusted by the length of a signal transmission line which is a distributed-constant line and, hence, the length of the signal transmission line needs to be increased in order to considerably shift the phase. In this case, the shape of a multilayer body forming the signal transmission line is expanded. This makes it difficult to reduce the size of the high-frequency circuit. Further, it is not easy to determine the length and conductor pattern of the signal transmission line for obtaining the optimum amount of phase shift under the constraint of the shape as the multilayer module of the high-frequency circuit. Hence, with the existing configuration disclosed in Japanese Unexamined Patent Application Publication No. 2001-86026, it is difficult to facilitate realization of, and reduction in the size of, a high-frequency circuit which includes a switch IC and has excellent harmonic distortion characteristics and out-of-band characteristics.

SUMMARY OF THE INVENTION

Preferred embodiments of the present invention provide a high-frequency switch module with excellent harmonic distortion characteristics and out-of-band characteristics without increasing the size of the module.

Preferred embodiments of the present invention are related to a high-frequency switch module that includes a common terminal and a plurality of individual terminals and that includes a switch IC that connects one of the plurality of individual terminals through switching to the common terminal through on/off control of a semiconductor switch device. Harmonic signals are output from the common terminal and individual terminals of the switch IC in the high-frequency switch module. The high-frequency switch module includes a filter circuit that is connected between a first individual terminal of the plurality of individual terminals and a first external connection terminal to which a high-frequency signal is input from outside and that attenuates a harmonic component of the high-frequency signal. The high-frequency switch module includes a phase adjustment circuit that is connected between the filter circuit and the first individual terminal and includes an inductor and a capacitor. In the phase adjustment circuit, values of the inductor and the capacitor are determined in such a manner that an amplitude of a harmonic signal output from the common terminal and an amplitude of a harmonic signal that is output from the first individual terminal and that is reflected at the filter circuit and returns to the first individual terminal cancel each other out.

With this configuration, a harmonic signal output from the first individual terminal is reflected by a filter circuit through the phase adjustment circuit including an inductor and a capacitor and output to the common terminal through the phase adjustment circuit and the switch IC. In the configuration of a preferred embodiment of the present invention, it is easy to adjust the phase adjustment amount for the harmonic signal returned to the common terminal as a result of the phase adjustment circuit being defined by a combination of an inductor and a capacitor. Hence, compared with an existing phase adjustment circuit using a distributed constant line, the degree of freedom in configuration to obtain a desired amount of phase adjustment is increased, and it is easy to realize a reduction in size and enhance the harmonic distortion characteristics and out-of-band characteristics.

Further, in a high-frequency switch module according to a preferred embodiment of the present invention, it is preferable that the values of the inductor and the capacitor be determined in such a manner that a phase difference between the harmonic signal from the common terminal and the harmonic signal from the first individual terminal is between 90° and 270°.

With this configuration, the harmonic signal from the common terminal and the harmonic signal from the first individual terminal at least cancel each other out and the level of a harmonic signal output from the common terminal is significantly reduced.

Further, in a high-frequency switch module according to a preferred embodiment of the present invention, it is preferable that the values of the inductor and the capacitor be determined in such a manner that the phase difference between the harmonic signal from the common terminal and the harmonic signal from the first individual terminal is 180°.

With this configuration, the harmonic signal from the common terminal and the harmonic signal from the first individual terminal completely cancel each other out, and no harmonic signals are output from the common terminal.

Further, it is preferable that in a high-frequency switch module according to a preferred embodiment of the present invention, the phase adjustment circuit is a low pass filter having a pass band that includes a frequency band of a harmonic signal.

With this configuration, the phase adjustment circuit not only allows the phase of a harmonic signal to be adjusted for canceling out, but also allows attenuation of higher-order harmonic signals whose fundamental-frequency signal is a high-frequency signal which is input from the filter circuit side of the switch IC (for example, third or higher harmonic signals in the case where the above-described harmonic signal is a second harmonic signal).

Further, a phase adjustment circuit in a high-frequency switch module according to a preferred embodiment of the present invention may be a high pass filter having a pass band that includes a frequency band of the high-frequency signal.

With this configuration, the phase adjustment circuit not only allows the phase of a harmonic signal to be adjusted for canceling out, but also allows static electricity input from the common terminal side of the switch IC to be significantly reduced. As a result, the ESD effect of the filter circuit is enhanced and the ESD effect of the high-frequency switch module is increased.

Further, a filter circuit of a high-frequency switch module according to a preferred embodiment of the present invention preferably is a notch filter in which a frequency of the harmonic signal is equal or substantially equal to an attenuation pole frequency.

With this configuration, the harmonic signals of an input high-power high-frequency signal are effectively attenuated, and also, the amount of reflection of harmonic signals generated by the switch IC and reflected from the filter circuit to the phase adjustment circuit side is maintained high. As a result, the difference between the level of a harmonic signal output from the common terminal and the level of a harmonic signal reflected by the filter circuit is decreased, and thus the cancelling-out effect is increased.

Further, it is preferable that a high-frequency switch module according to a preferred embodiment of the present invention have the following configuration. The filter circuit includes an LC parallel resonant circuit in which a filter capacitor and a filter inductor are connected in parallel. The LC parallel resonant circuit is connected between the first external connection terminal and the phase adjustment circuit.

With this configuration, the band-pass characteristics other than in the frequency band of a harmonic signal are good, such that transmission and reception characteristics desirable to a high-frequency switch module are enhanced.

Further, a high-frequency switch module according to a preferred embodiment of the present invention may have the following configuration. The filter circuit includes an LC series resonant circuit in which a filter capacitor and a filter inductor are connected in series, and the LC series resonant circuit is connected between a ground and a connection line between the first external connection terminal and the phase adjustment circuit.

With this configuration, although operations and effects such as those in the case of using the LC parallel resonant circuit described above are not obtained, a frequency band providing attenuation equal to or higher than a predetermined attenuation is wide, and the amount of reflection of a harmonic signal is unlikely to be decreased even when the frequency of the harmonic signal shifts.

In a high-frequency switch module according to a preferred embodiment of the present invention, a filter circuit may be a band pass filter having a pass band that includes a frequency band of the high-frequency signal.

With this configuration, the frequency of a harmonic signal is within an attenuation band of the band pass filter. Attenuation, i.e., a reflection amount, outside of the pass band of a band pass filter is large and, hence, the level of a harmonic signal reflected by the filter circuit is unlikely to be decreased.

In a high-frequency switch module according to a preferred embodiment of the present invention, the band pass filter may be a filter that is a constituent of a duplexer.

With this configuration, in the case of an example in which the duplexer is connected to the first external connection terminal, a filter circuit need not be provided separately from the duplexer, such that the high-frequency switch module is able to be configured as a small module.

Further, it is preferable that a high-frequency switch module according to a preferred embodiment of the present invention have the following configuration. The above-described switch IC of the high-frequency switch module is a switch IC for a low band. Further, the high-frequency switch module preferably includes a second switch IC for a high band; and an antenna side-duplexer that includes a connection terminal for connection to an antenna, a low-band-side terminal connected to the common terminal of the switch IC, and a high-band-side terminal connected to a common terminal of the second switch IC, and that separates a high-frequency signal in the low band and a high-frequency signal in the high band. A high-frequency signal input to the first individual terminal and a second high-frequency signal transmitted through the second switch circuit are at least temporarily communicated at the same time.

With this configuration, in the high-frequency switch module that simultaneously transmits and receives high-frequency signals in a plurality of band classes (frequency regions) in, for example, carrier aggregation, crosstalk of harmonic signals of a low-band high-frequency signal to the high band side circuit is significantly reduced.

Further, a high-frequency switch module according to a preferred embodiment of the present invention may have the following configuration. A plurality of line conductors and a selection member are provided between the filter circuit and the phase adjustment circuit. The plurality of line conductors are connected to the filter circuit and have different lengths. The selection member selectively connects one of the plurality of line conductors to the phase adjustment circuit.

Further, a high-frequency switch module according to a preferred embodiment of the present invention may have the following configuration. A plurality of line conductors and a selection member are provided between the phase adjustment circuit and the first individual terminal. The plurality of line conductors are connected to the phase adjustment circuit and have different lengths. The selection member selectively connects one of the plurality of line conductors to the first individual terminal.

With these configurations, the line conductors other than the connected one become open stubs and, hence, further phase adjustment for harmonic signals become possible using these open stubs. Since the shape of the open stub changes in accordance with a selected line conductor, different phase adjustment amounts are able to be selected, such that it is easy to appropriately select a suitable phase adjustment amount.

Further, it is preferable that a high-frequency switch module according to a preferred embodiment of the present invention have the following configuration. The high-frequency switch module preferably includes and is defined by a multilayer body that is preferably formed by stacking a plurality of dielectric layers having conductor patterns formed thereon. The inductor of the phase adjustment circuit preferably is a surface mount inductor device mounted on the multilayer body. The capacitor of the phase adjustment circuit preferably is a surface mount capacitor device mounted on the multilayer body.

With this configuration, the phase adjustment circuit is able to be significantly reduced in size, irrespective of the phase adjustment amount. In addition, the phase adjustment amount is able to be changed by only replacing the surface mount devices. As a result, an appropriate amount of phase adjustment is easily realized and reduction in size is possible.

Further, it is preferable that a high-frequency switch module according to a preferred embodiment of the present invention have the following configuration. An inductor of the filter circuit is a surface mount inductor device mounted on the multilayer body, and a capacitor of the filter circuit is a surface mount capacitor device mounted on the multilayer body.

With this configuration, a high-frequency switch module which allows an appropriate amount of phase adjustment to be easily realized and enables reduction in size is provided.

According to various preferred embodiments of the present invention, a small-sized high-frequency switch module having excellent harmonic distortion characteristics and out-of-band characteristics is easily realized.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 illustrates simulation results regarding the level of a second harmonic signal at an antenna ANT in the configuration of a first preferred embodiment of the present invention and an existing configuration.

DETAILED DESCRIPTION OF THE PREFERRED EMBODIMENTS

Figure 1:
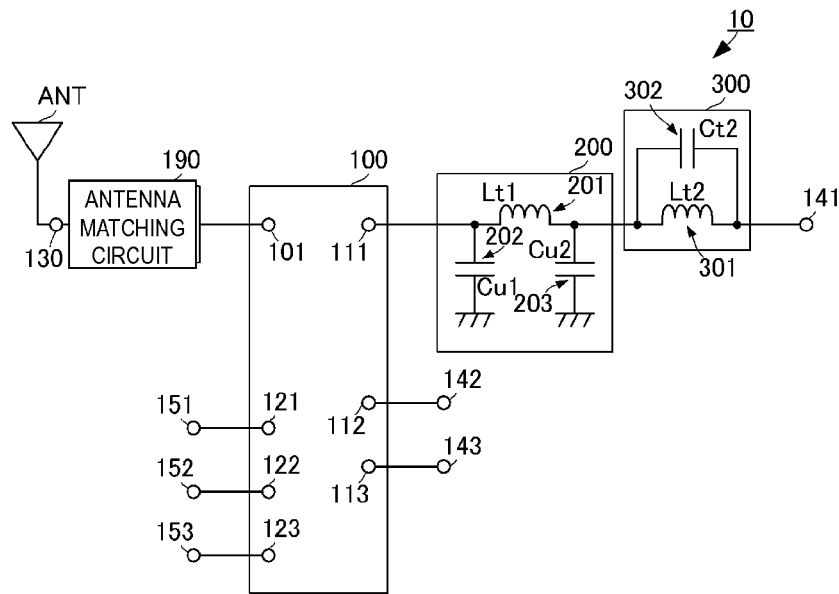
FIG. 1 is a circuit diagram of a high-frequency switch module according to a first preferred embodiment of the present invention.

A high-frequency switch module according to a first preferred embodiment of the present invention will be described with reference to the drawings. FIG. 1 is a circuit diagram of the high-frequency switch module according to the first preferred embodiment of the present invention. Note that in the present preferred embodiment a switch IC having a single common terminal and three individual terminals will be described as an example. However, the number of the individual terminals is not limited to this, and may be any number other than one.

A high-frequency switch module 10 includes a switch IC 100, a phase adjustment circuit 200, a filter 300, and an antenna matching circuit 190. The high-frequency switch module 10 includes external connection terminals 130, 141, 142, 143, 151, 152, and 153. The external connection terminal 141 corresponds to the "first external connection terminal". The external connection terminal 130 is connected to an antenna ANT arranged outside of the high-frequency switch module 10.

The switch IC 100 includes a common terminal 101, individual terminals 111, 112, and 113, driving control terminals 121, 122, and 123. The individual terminal 111 corresponds to the "first individual terminal". The switch IC 100 connects the common terminal 101 to one of the individual terminals 111, 112, and 113 through switching on the basis of a driving voltage and control signals input to the driving control terminals 121, 122, and 123. More specifically, the switch IC 100 has a configuration in which semiconductor switches such as field effect transistors (FETs) are connected between the common terminal 101 and the individual terminals 111, 112, and 113. The switch IC 100 supplies power to the semiconductor switches using a driving voltage, and performs switching of a semiconductor switch that is controlled so as to be switched on and semiconductor switches that are controlled so as to be switched off using control signals. Through such on/off control of the semiconductor switches, the switch IC 100 causes the common terminal 101 to be connected to one of the individual terminals 111, 112, and 113.

The antenna matching circuit 190 is connected between the common terminal 101 and the external connection terminal 130. Although not illustrated, the antenna matching circuit 190 preferably includes, for example, a series inductor, a capacitor that connects a connection node between the series inductor and the external connection terminal 130 to the ground, an inductor that connects a connection node between the series inductor and the common terminal 101 to the ground, and the like.

The driving control terminals 121, 122, and 123 are respectively connected to the external connection terminals 151, 152, and 153. A driving voltage and control signals are supplied through the external connection terminals 151, 152, and 153.

The individual terminal 111 is connected to the external connection terminal 141 with the phase adjustment circuit 200 and the filter circuit 300 interposed therebetween.

The individual terminals 112 and 113 are respectively connected to the external connection terminals 142 and 143. Note that circuit devices such as filters may be connected between these individual terminals and the external connection terminals.

The phase adjustment circuit 200 is connected between the individual terminal 111 and the filter circuit 300. The phase adjustment circuit 200 includes an inductor 201 and capacitors 202 and 203. The inductor 201 is connected in series between the individual terminal 111 and the filter circuit 300. The individual terminal 111 side of the inductor 201 is connected to the ground with the capacitor 202 interposed therebetween. The filter circuit 300 side of the inductor 201 is connected to the ground with the capacitor 203 interposed therebetween.

An inductance Lt1 of the inductor 201, a capacitance Cu1 of the capacitor 202, and a capacitance Cu2 of the capacitor 203 are set on the basis of a phase shift condition regarding a second harmonic signal described later.

The filter circuit 300 includes a filter inductor 301 and a filter capacitor 302. The filter inductor 301 is connected between the phase adjustment circuit 200 and the external connection terminal 141. The filter capacitor 302 is connected in parallel with the filter inductor 301. As a result, the filter circuit 300 is an LC parallel resonant circuit including the filter inductor 301 and the filter capacitor 302. With such a circuit configuration, the filter circuit 300 defines and functions as an LC parallel resonant notch filter.

The value (inductance) Lt2 of the filter inductor 301 and the value (capacitance) Ct2 of the filter capacitor 302 are set in such a manner that the frequency of the second harmonic signal of a high-frequency signal input at the external connection terminal 141 becomes the same or approximately the same as the attenuation pole frequency of the notch filter.

Figure 2:
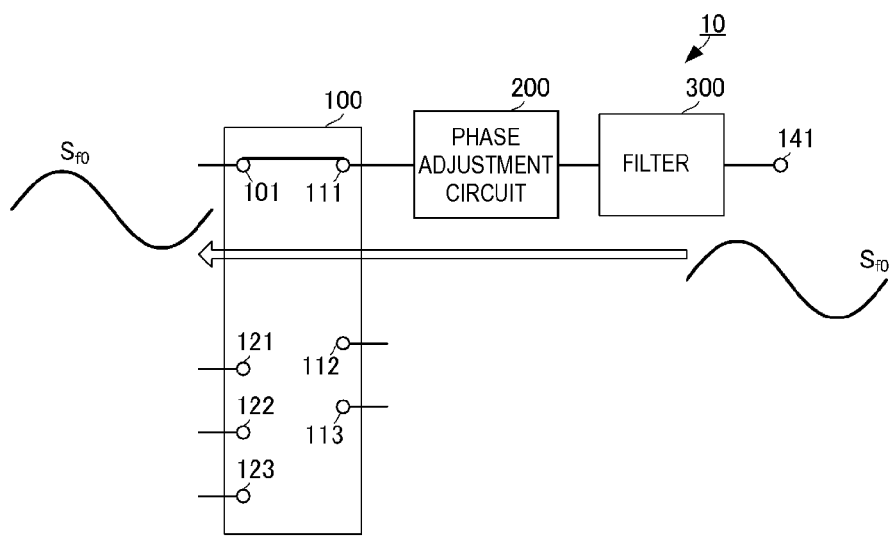
FIG. 2 is a diagram illustrating how a high-frequency signal is transmitted when the high-frequency signal (high power) is input through an external connection terminal.
Figure 3:
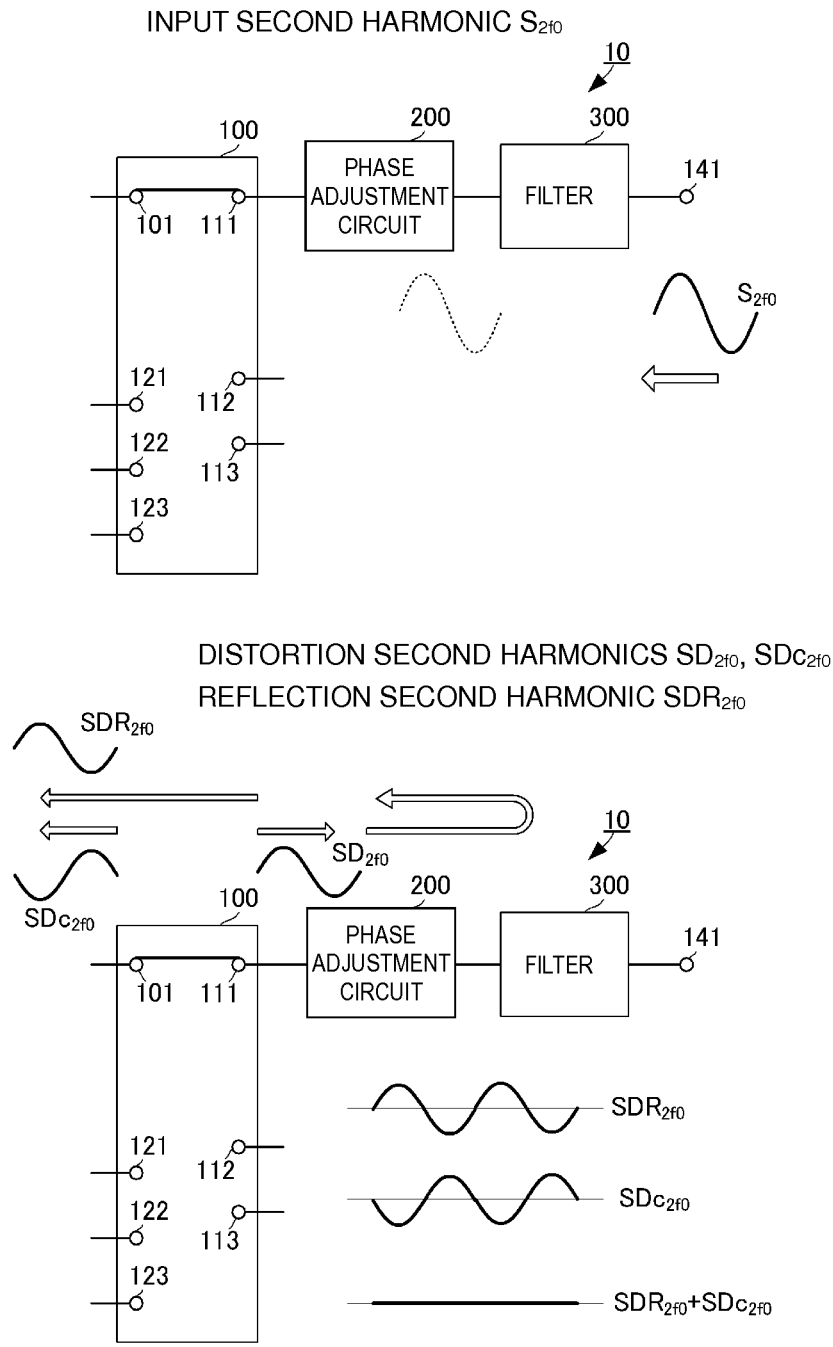
FIG. 3 is a diagram illustrating how the second harmonic signal of a high-frequency signal is transmitted and how a distortion second harmonic signal is transmitted.

FIG. 2 is a diagram illustrating how a high-frequency signal is transmitted in the case where the high-frequency signal (high power) is input at the external connection terminal. Note that "high power" indicates a power level at which a distortion harmonic signal is generated from the switch IC 100 as a result of a high-frequency signal being input to the switch IC 100 used in the high-frequency switch module 10. FIG. 3 is a diagram illustrating how the second harmonic signal of a high-frequency signal is transmitted and how a distortion second harmonic signal is transmitted. Note that FIG. 2 and FIG. 3 illustrate a state in which the individual terminal 111 and the common terminal 101 of the switch IC 100 are electrically connected to each other.

As illustrated in FIG. 2, a high-frequency signal (fundamental harmonic) $S_{f0}$ having the fundamental frequency input at the external connection terminal 141 is input to the individual terminal 111 of the switch IC 100 through the filter circuit 300 and the phase adjustment circuit 200. The high-frequency signal $S_{f0}$ Input to the individual terminal 111 of the switch IC 100 is output from the common terminal 101.

As illustrated in FIG. 3 (upper portion), a second harmonic signal $S_{2f0}$ of a high-frequency signal input at the external connection terminal 141 is attenuated by the filter circuit 300. As a result, the input second harmonic signal $S_{2f0}$ is not transmitted to the phase adjustment circuit 200 and the switch IC 100, and is not output from the common terminal 101 of the switch IC 100.

When a high-frequency signal $S_{f0}$ having the fundamental frequency is input to the switch IC 100, in the case where the high-frequency signal $S_{f0}$ has high power, the semiconductor switch is distorted and distortion harmonic signals are generated. Note that most of the power of the distortion harmonic signals corresponds to a second harmonic signal $SD_{2f0}$. The distortion second harmonic signal $SD_{2f0}$ is output to the common terminal 101 and the individual terminal 111.

The distortion second harmonic signal $SD_{2f0}$ output to the individual terminal 111 is transmitted to the filter circuit 300 through the phase adjustment circuit 200. Since the frequency of the second harmonic signal is the same as the attenuation pole frequency in the filter circuit 300, the distortion second harmonic signal $SD_{2f0}$ is reflected at the filter circuit 300. This reflected second harmonic signal $SDR_{2f0}$ is transmitted through the phase adjustment circuit 200 and is input to the individual terminal 111. The reflected second harmonic signal $SDR_{2f0}$ is transmitted from the individual terminal 111 to the common terminal 101.

Hence, a distortion second harmonic signal $SDc_{2f0}$ that is originally output from the common terminal 101 and the reflected second harmonic signal $SDR_{2f0}$ are output from the common terminal 101 in such a manner as to be superposed with each other.

Here, the inductance Lt1 of the inductor 201 and the capacitance Cu1 of the capacitor 202, and the capacitance Cu2 of the capacitor 203 in the phase adjustment circuit 200 are determined in such a manner that the distortion second harmonic signal $SDc_{2f0}$ and the reflected second harmonic signal $SDR_{2f0}$ have opposite phases at the common terminal 101. In other words, the inductance Lt1 of the inductor 201 and the capacitance Cu1 of the capacitor 202, and the capacitance Cu2 of the capacitor 203 in the phase adjustment circuit 200 are determined in such a manner that the distortion second harmonic signal output from the individual terminal 111 is reflected by the filter circuit 300 and returns to the switch IC 100, and the phase of the reflected second harmonic signal $SDR_{2f0}$ at the common terminal 101 is shifted by 180° compared with the phase of the distortion second harmonic signal $SDc_{2f0}$ at the common terminal 101.

With this configuration described above, as illustrated in FIG. 3 (lower portion), the distortion second harmonic signal $SDc_{2f0}$ and the reflected second harmonic signal $SDR_{2f0}$ cancel each other out at the common terminal 101, resulting in a state in which the second harmonic signal is not output from the common terminal 101. As a result, the second harmonic signal is not output to the external connection terminal 130 (antenna ANT) side, such that the harmonic distortion characteristics and the out-of-band characteristics of the high-frequency switch module 10 are improved. The harmonic distortion characteristics are characteristics which become better as harmonic signals whose fundamental frequency is the frequency of a transmitted and received high-frequency signal become more unlikely to be output to the outside. The out-of-band characteristics are characteristics which are better when large attenuation is obtained in a frequency band outside of a transmission/reception frequency band.

Further, as illustrated in the present preferred embodiment, since the phase adjustment circuit 200 includes and is defined by the inductor 201 and the capacitors 202 and 203, the phase of the second harmonic signal returning to the common terminal 101 is able to be adjusted more easily than in a configuration in which a micro-strip line, which is a distributed-constant line, is used. Accordingly, compared with an existing phase adjustment circuit that uses a distributed constant line, the degree of freedom in shape for obtaining a desired amount of phase adjustment is increased and reduction in size is more easily realized.

FIG. 4 illustrates simulation results regarding the level of a second harmonic at the antenna ANT in the configuration of the present preferred embodiment and an existing configuration. Note that FIG. 4 also illustrates the case of the existing switch IC configuration with a double-sized FET. In the simulation of FIG. 4, the level of an input high-frequency signal is +26 dBm.

As illustrated in FIG. 4, the second harmonic level decreases from −80 dBm in the existing configuration to about −95 dBm in the configuration of the present preferred embodiment, for example. In general, it is known that the output of a harmonic signal is significantly reduced by expanding the shape of the FET of a switch IC. Hence, simulation was also performed for the case of the existing switch IC configuration with a double-sized FET. As a result, the case of the existing switch IC configuration with a double-sized FET shows −83 dBm. Hence, the configuration of the present preferred embodiment allows the second harmonic signal level to be decreased more than in this configuration.

Further, with the configuration described above, the phase adjustment circuit 200 functions as a π-type low pass filter. Here, the low pass filter is set by adjusting the inductance Lt1 of the inductor 201, the capacitance Cu1 of the capacitor 202, and the capacitance Cu2 of the capacitor 203 in such a manner that the frequency of a second harmonic signal is within the frequency band of the pass band and the frequency band of a third harmonic signal is the attenuation band.

With this configuration, the signal level of the second harmonic signal that is reflected by the filter circuit 300 and returns to the switch IC 100 is negligibly decreased. Hence, the cancelling-out effect at the common terminal 101 is increased. As a result, the second harmonic signal output from the common terminal 101 is further considerably reduced, such that the harmonic distortion characteristics and out-of-band characteristics of the high-frequency switch module 10 are further improved.

Further, third and higher harmonic signals that have passed through the filter circuit 300 are attenuated by the phase adjustment circuit 200 and, hence, the second and higher harmonic signals output from the common terminal 101 are also considerably reduced. As a result, general harmonic distortion characteristics and out-of-band characteristics of the high-frequency switch module 10 are further enhanced.

The high-frequency switch module 10 described above preferably includes and is defined by a multilayer body that is preferably formed by stacking a plurality of dielectric layers. Conductor patterns that define the circuit patterns of the high-frequency switch module 10 are provided on predetermined dielectric layers. The top surface of the multilayer body includes surface-mount circuit devices provided thereon and the bottom surface of the multilayer body includes mounting lands to achieve external connection terminals provided thereon.

Figure 5:
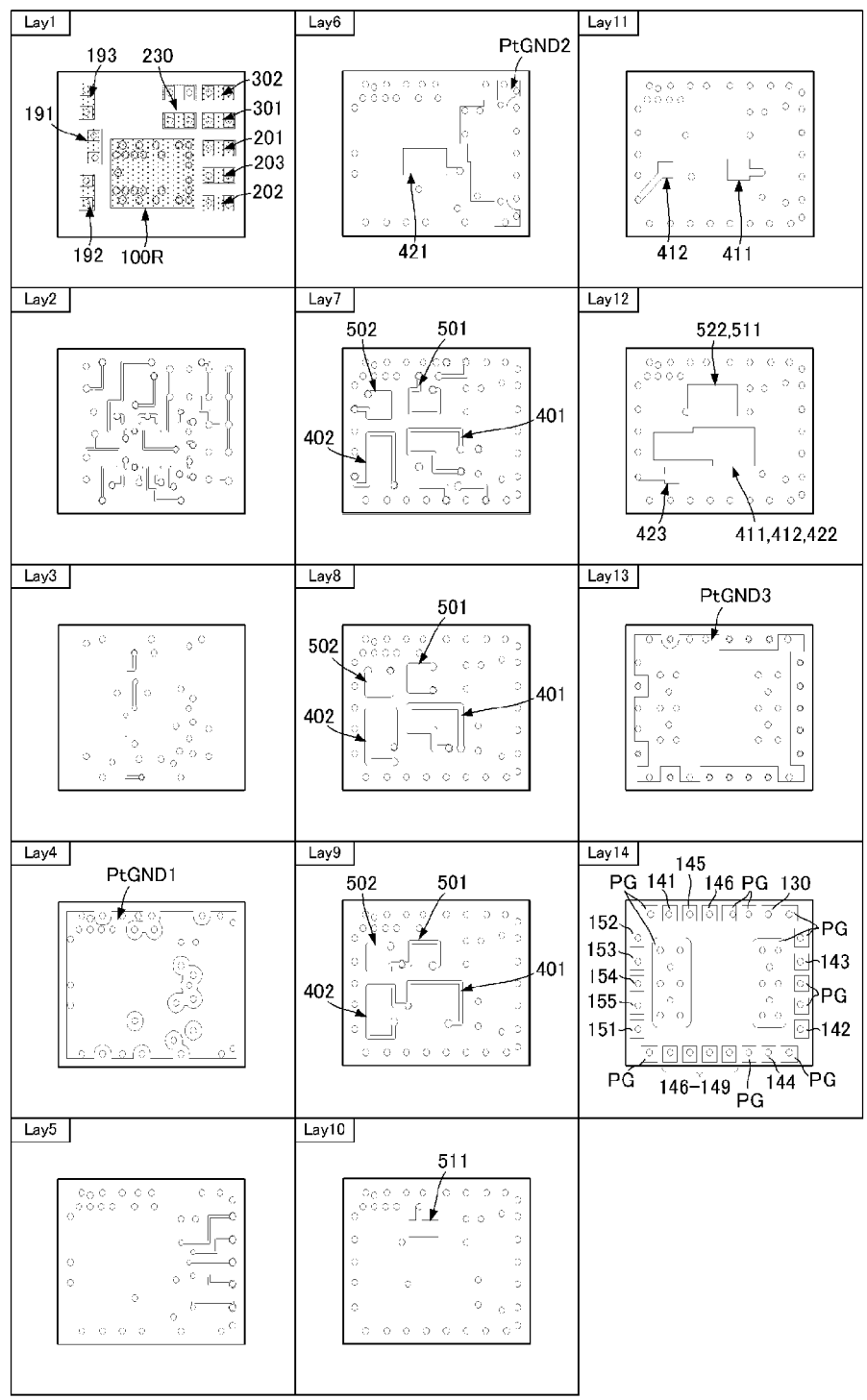
FIG. 5 is a stacking diagram of a high-frequency switch module of an aspect of the first preferred embodiment of the present invention.
Figure 6:
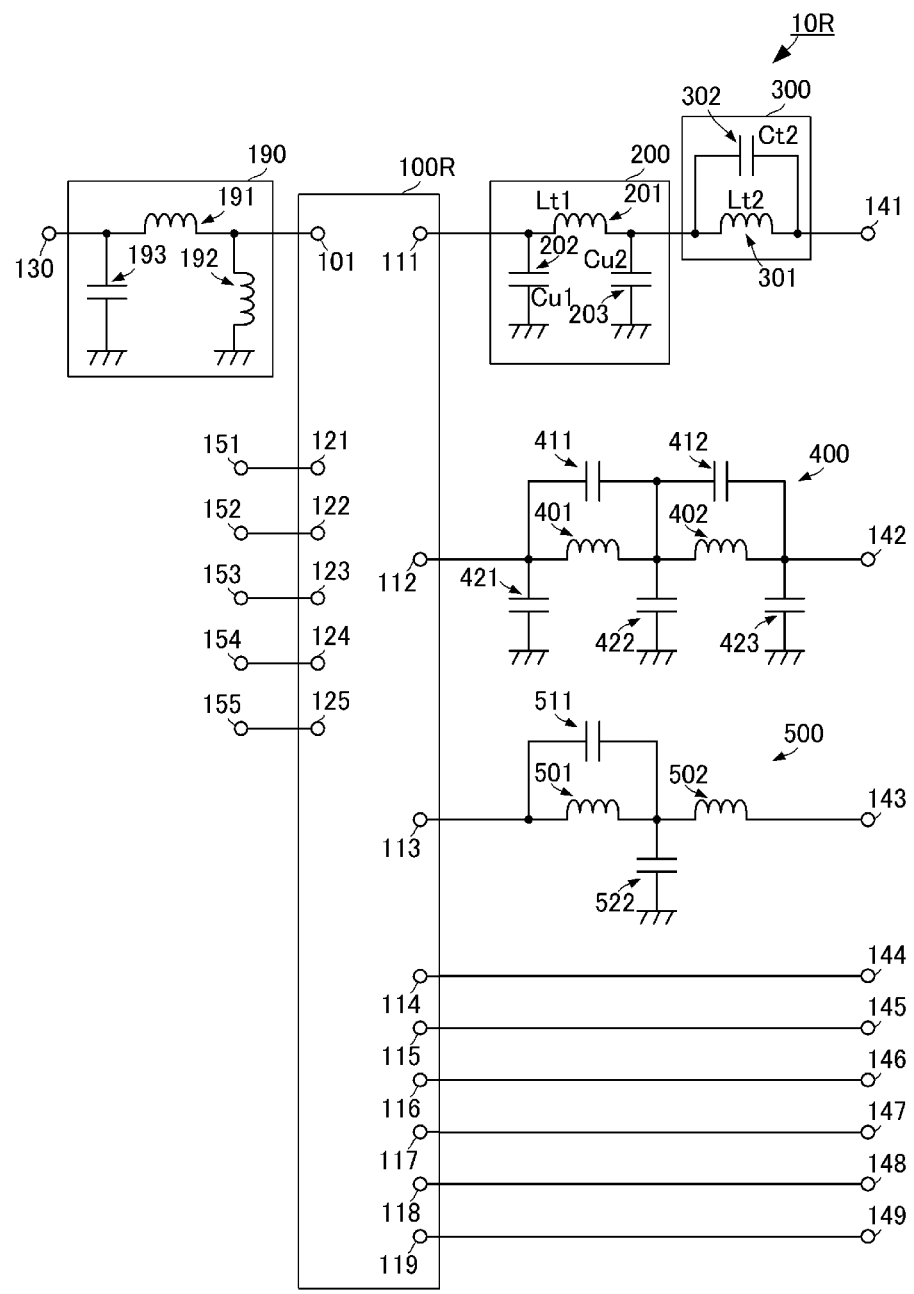
FIG. 6 is a circuit diagram of a high-frequency module realized by the patterns in the stacking diagram illustrated in FIG. 5.

FIG. 5 is a stacking diagram of a high-frequency switch module that is an example of the present preferred embodiment. Note that symbols ○ (round shapes) illustrated on each dielectric layer denote conductive vias extending through the dielectric layer in the thickness direction. FIG. 6 is a circuit diagram of the high-frequency module realized by the patterns in the stacking diagram of FIG. 5.

A high-frequency switch module 10R illustrated in FIG. 5 and FIG. 6 includes a switch IC 100R, an antenna matching circuit 190, the phase adjustment circuit 200, the filter circuit 300, low pass filters 400 and 500. The phase adjustment circuit 200 and the filter circuit 300 are preferably the same as those in the high-frequency switch module 10 described above.

The high-frequency switch module 10R includes external connection terminals 130, 141-149, and 151-155.

The switch IC 100R includes the common terminal 101, nine individual terminals 111-119, and five driving control terminals 121-125. The common terminal 101 is connected to one of the individual terminals 111-119 in accordance with a driving voltage and control signals supplied to the driving control terminals 121-125.

An antenna matching inductor 191 is connected between the common terminal 101 and the external connection terminal 130. The antenna matching circuit 190 includes antenna matching inductors 191 and 192 and an antenna matching capacitor 193. The antenna matching inductor 191 is connected between the common terminal 101 and the external connection terminal 130. The common terminal 101 side of the antenna matching inductor 191 is connected to the ground with the antenna matching inductor 192 interposed therebetween. The external connection terminal 130 side of the antenna matching inductor 191 is connected to the ground with the antenna matching capacitor 193 interposed therebetween.

The phase adjustment circuit 200 and the filter circuit 300 are connected between the individual terminal 111 and the external connection terminal 141.

The low pass filter 400 is connected between the individual terminal 112 and the external connection terminal 142. The low pass filter 400 includes LPF inductors 401 and 402, LPF capacitors 411, 412, 421, 422, and 423. The LPF inductors 401 and 402 are connected in series between the individual terminal 112 and the external connection terminal 142. The LPF capacitor 411 is connected in parallel with the LPF inductor 401. The LPF capacitor 412 is connected in parallel with the LPF inductor 402. The individual terminal 112 side of the LPF inductor 401 is connected to the ground with the LPF capacitor 421 interposed therebetween. A connection node between the LPF inductors 401 and 402 is connected to the ground with the LPF capacitor 422 interposed therebetween. The external connection terminal 142 side of the LPF inductor 402 is connected to the ground with the LPF capacitor 423 interposed therebetween. In the low pass filter 400, the values of the LPF inductors 401 and 402 and the LPF capacitors 411, 412, 421, 422, and 423 are determined in such a manner that the frequency band of a high-frequency signal input to the external connection terminal 142 is located within the pass band and the frequencies of the second and higher harmonic signals are located in the attenuation band.

The low pass filter 500 is connected between the individual terminal 113 and the external connection terminal 143. The low pass filter 500 includes LPF inductors 501 and 502 and LPF capacitors 511 and 522. The LPF capacitor 511 is connected in parallel with the LPF inductor 501. A connection node between the LPF inductors 501 and 502 is connected to the ground with the LPF capacitor 522 interposed therebetween. In the low pass filter 500, the values of the LPF inductors 501 and 502 and the LPF capacitors 511 and 522 are determined in such a manner that the frequency band of a high-frequency signal input to the external connection terminal 143 is located within the pass band and the frequencies of the second and higher harmonic signals are located in the attenuation band.

The individual terminals 114-119 are respectively connected to the external connection terminals 144-149. The driving control terminals 121-125 are respectively connected to the external connection terminals 151-155.

The high-frequency switch module 10R described above preferably includes and is defined by a multilayer body that is preferably formed by stacking 14 layers i.e., a dielectric layer Lay1 to a dielectric layer Lay14, as illustrated in FIG. 5. The dielectric layer Lay1 is the uppermost layer of the multilayer body and the dielectric layer Lay14 is the lowermost layer of the multilayer body. In the dielectric layer Lay1 to the dielectric layer Lay13, conductor patterns are provided on the upper-layer side, and a conductor layer is provided on the lower-layer side in the dielectric layer Lay14.

The switch IC 100, the inductor 201, the capacitors 202 and 203, the filter inductor 301, the filter capacitor 302, the antenna matching inductors 191 and 192, and the antenna matching capacitor 193 are mounted on the upper surface (top surface of the multilayer body) of the dielectric layer Lay1, which is the uppermost layer (first layer). These circuit devices, which preferably are surface-mount circuit devices, are mounted on device lands provided on the top surface. The inductor 201, the capacitors 202 and 203, the filter inductor 301, and the filter capacitor 302 are spaced apart from the antenna matching inductors 191 and 192 and the antenna matching capacitor 193 with the switch IC 100 therebetween.

The inductor 201 and the capacitors 202 and 203 that define the phase adjustment circuit 200 are mounted in a line in such a manner as to be close to one another. The filter inductor 301 and the filter capacitor 302 are also arranged in such a manner as to be close to each other and close to and in line with the inductor 201 and the capacitors 202 and 203. With this configuration, the conductor patterns connecting the circuit devices of the phase adjustment circuit 200 to one another are able to be short, such that the amount of phase shift due to the conductor patterns is considerably reduced. In addition, a conductor pattern connecting the phase adjustment circuit 200 to the filter circuit 300 is able to be short, such that phase shift due to this conductor pattern is considerably reduced. As a result, the amount of phase shift of a second harmonic signal returning to the switch IC 100 is accurately set by the inductor 201 and the capacitors 202 and 203.

On the dielectric layer Lay2, which is the second layer, and the dielectric layer Lay3, which is the third layer, conductor line patterns are appropriately provided. Conductor patterns that connect the switch IC 100, the inductor 201, the capacitors 202 and 203, the filter inductor 301, and the filter capacitor 302 to one another are provided on these dielectric layers. As a result, the amount of phase shift of a second harmonic signal returning to the switch IC 100 is able to be set with high accuracy by the inductor 201 and the capacitors 202 and 203.

An inner ground conductor PtGND1 is provided on substantially the whole surface of the dielectric layer Lay4, which is the fourth layer.

On the dielectric layer Lay5, which is the fifth layer, routing conductor patterns are appropriately provided.

On the dielectric layer Lay6, which is the sixth layer, an inner ground conductor PtGND2 and a rectangular conductor for the capacitor 421 are provided. The inner ground conductor PtGND2 is configured such that the routing conductor patterns on the dielectric layer Lay5 are sandwiched between the inner ground conductor PtGND2 and the inner ground conductor PtGND1 in the stacking direction.

On the dielectric layers Lay7, Lay8, and Lay9, which are the seventh layer, eighth layer, and ninth layer, line-shaped winding conductors for the low pass filter inductors 401, 402, 501, and 502 are provided.

On the dielectric layer Lay10, which is the tenth layer, a rectangular conductor for the low pass filter capacitor 511 is provided. On the dielectric layer Lay11, which is the eleventh layer, rectangular conductors for the low pass filter capacitors 411 and 422 are provided. On the dielectric layer Lay12, which is the twelfth layer, rectangular conductors for the low pass filter capacitors 411, 412, 422, 423, 511, and 522 are provided.

An inner ground conductor PtGND3 is provided on substantially the whole surface of the dielectric layer Lay13, which is the thirteenth layer.

On the dielectric layer Lay14, which is the fourteenth layer (lowermost layer), external connection lands for the external connection terminals 130, 141, 142-149, and 151-155 and external ground connection lands PG are provided.

In this manner, by using surface mount circuit devices as the inductor 201, the capacitors 202 and 203 defining the phase adjustment circuit 200, even when the amount of phase shift is increased, the size of the multilayer body is further reduced. Further, the size of the multilayer body is significantly reduced by using surface mount devices as the filter inductor 301 and the filter capacitor 302 defining the filter circuit 300.

Further, with the configuration described above, the inner ground conductor PtGND1 is arranged between the low pass filters 400 and 500 and the phase adjustment circuit 200 and the filter circuit 300. As a result, even when the phase adjustment circuit 200 and the filter circuit 300 are superposed with the low pass filters 400 and 500 when viewed in the stacking direction, the phase adjustment circuit 200 and the filter circuit 300 is highly isolated from the low pass filters 400 and 500. In other words, the size of the high-frequency switch module 10 is very small while keeping isolation at a high level.

Further, the external connection land for the external connection terminal 130 connected to the antenna ANT is separated from other external connection lands with the external ground connection land PG sandwiched therebetween. As a result, high isolation between the external connection land for the external connection terminal 130 connected to the antenna ANT and the other external connection lands is ensured.

Note that in the high-frequency switch module described above, a notch filter including an LC parallel resonant circuit preferably is used as the filter circuit 300, for example.

Figure 7:
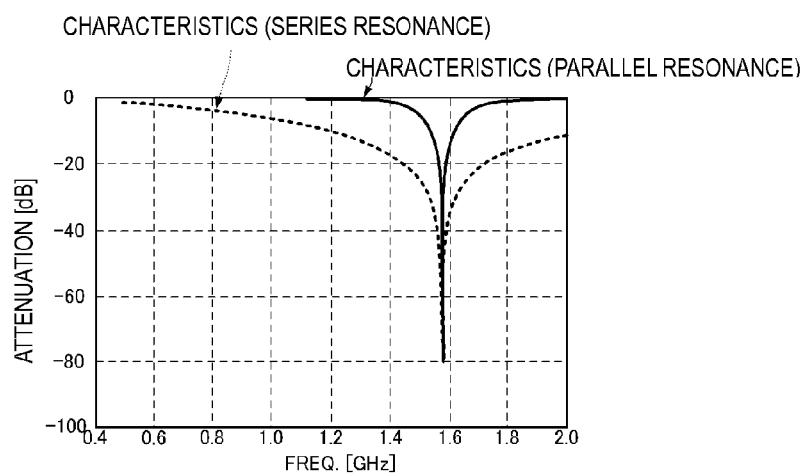
FIG. 7 is a diagram illustrating the attenuation characteristics of an LC parallel resonant circuit and an LC series resonant circuit and an example circuit configuration of the LC series resonant circuit.
Figure 7:
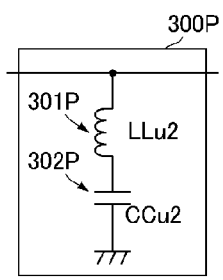

However, a notch filter including an LC series resonant circuit may be used instead. FIG. 7 is a diagram illustrating the attenuation characteristics of an LC parallel resonant circuit and an LC series resonant circuit and an example of the circuit configuration of the LC series resonant circuit. A filter circuit 300P defined by the LC series resonant circuit includes an inductor 301P and a capacitor 302P. The inductor 301P and the capacitor 302P are connected in series with each other. One end of this series circuit is connected to a predetermined position on a conductor line connecting the phase adjustment circuit 200 to the external connection terminal 141. The other end of the series circuit is connected to the ground. By appropriately setting the value (inductance) LLu2 of the inductor 301P and the value (capacitance) CCu2 of the capacitor 302P, the attenuation pole frequency of the notch filter is made to be the same as the frequency of a second harmonic signal. The filter circuit 300P having such a configuration also realizes operations and effects similar to those of the filter circuit 300 defined by an LC parallel resonant circuit.

However, by using the filter circuit 300 defined by an LC parallel resonant circuit, the attenuation pole characteristics are steeper than in the case of using the filter circuit 300P formed of an LC series resonant circuit, as illustrated in FIG. 7. Hence, attenuation of frequencies other than the second harmonic signal frequency is significantly reduced. As a result, a high-frequency signal having a frequency which should not be attenuated, for example, a high-frequency signal having the fundamental frequency is transmitted without attenuation, such that the transmission and reception characteristics desirable to the high-frequency switch module 10 is enhanced. Note that, with an LC series resonant circuit, the attenuation band is widened and, hence, it becomes easy to attenuate the second harmonic signal, even when the second harmonic signal is in a range of frequencies.

Figure 8:
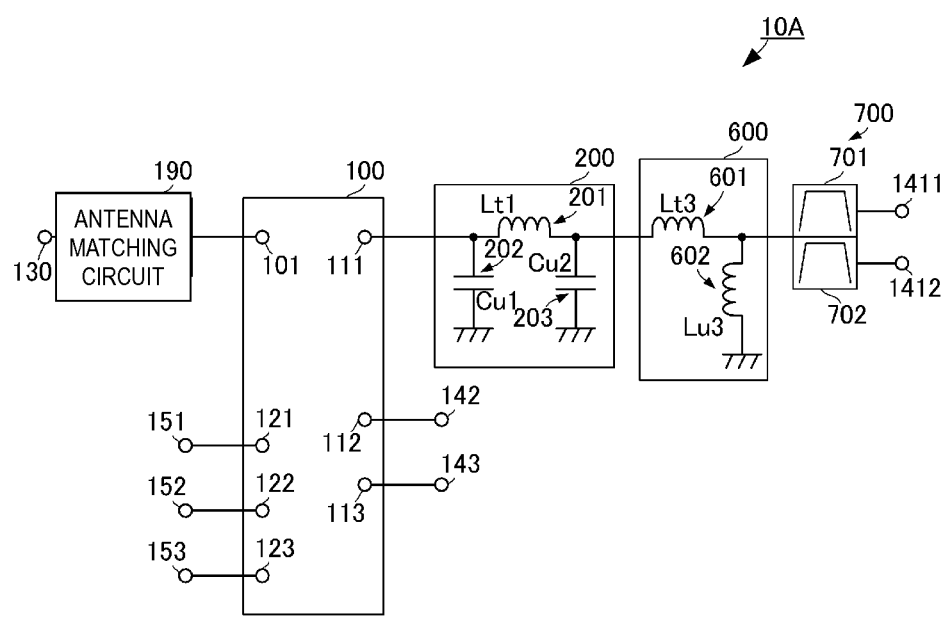
FIG. 8 is a circuit diagram of a high-frequency switch module according to a second preferred embodiment of the present invention.

Next, a high frequency switch module according to a second preferred embodiment will be described with reference to a drawing. FIG. 8 is a circuit diagram of the high-frequency switch module according to the second preferred embodiment. Compared with the high-frequency switch module 10 according to the first preferred embodiment, in a high-frequency switch module 10A of the present preferred embodiment, the filter circuit 300 is omitted and a duplexer 700 is preferably used instead. Since the high-frequency switch module 10A is preferably the same as the high-frequency switch module 10 according to the first preferred embodiment except for a circuit configuration regarding the duplexer 700, specific description of the same portions is omitted.

The duplexer 700 includes a first band pass filter 701 and a second band pass filter 702. The first band pass filter 701 and the second band pass filter 702 have different pass bands. The first band pass filter 701 is connected between an external connection terminal 1411 of the high-frequency switch module 10A and a first terminal of the duplexer. The first band pass filter 701 is a filter circuit which has a pass band that includes the frequency band of a first high-frequency signal input at the external connection terminal 1411 and has an attenuation band which is a frequency band higher than or equal to the frequency of a second harmonic signal. The second band pass filter 702 is connected between an external connection terminal 1412 of the high-frequency switch module 10A and the first terminal of the duplexer. The second band pass filter 702 is a filter circuit which has a pass band that includes the frequency band of the second high-frequency signal output to the external connection terminal 1412 and has an attenuation band that is a frequency band higher than or equal to the frequency of a second harmonic signal. Further, the second band pass filter 702 is also set in such a manner that the attenuation band includes the frequency of the second harmonic signal of the first high-frequency signal. The first high-frequency signal and the second high-frequency signal are respectively, for example, a transmission signal and a reception signal in the same band class.

The duplexer 700 is connected to the phase adjustment circuit 200 with a matching circuit 600 interposed therebetween. The matching circuit 600 includes matching circuit inductors 601 and 602. The matching circuit inductor 601 is connected between the phase adjustment circuit 200 and a duplexer first terminal of the duplexer 700. The matching circuit inductor 602 is connected between the duplexer 700 side of the matching circuit inductor 601 and the ground. By appropriately setting the values (inductances) Lt3 and Lu3 of the matching circuit inductors 601 and 602, impedance matching between the phase adjustment circuit 200 and the duplexer 700 is performed.

With this configuration, a distortion second harmonic signal output from the individual terminal 111 is reflected by the duplexer 700. This utilizes the fact that the reflection coefficient outside of the pass band of a band pass filter is high. The distortion second harmonic signal reflected by the duplexer 700 returns to the switch IC 100, and is cancelled out at the common terminal 101 by the distortion second harmonic signal output from the common terminal 101, as in the first preferred embodiment described above.

As described above, a filter circuit can be omitted in the case where a duplexer is connected to the individual terminal 111.

Note that it is preferable to set the inductances Lt3 and Lu3 of the matching circuit inductors 601 and 602 of the matching circuit 600, taking into consideration the function of the phase adjustment circuit 200 shifting the phase of the second harmonic signal. In other words, it is preferable to set the amount of phase shift of a second harmonic signal for the cancelling out described above, by using the phase adjustment circuit 200 and the matching circuit 600.

Figure 9:
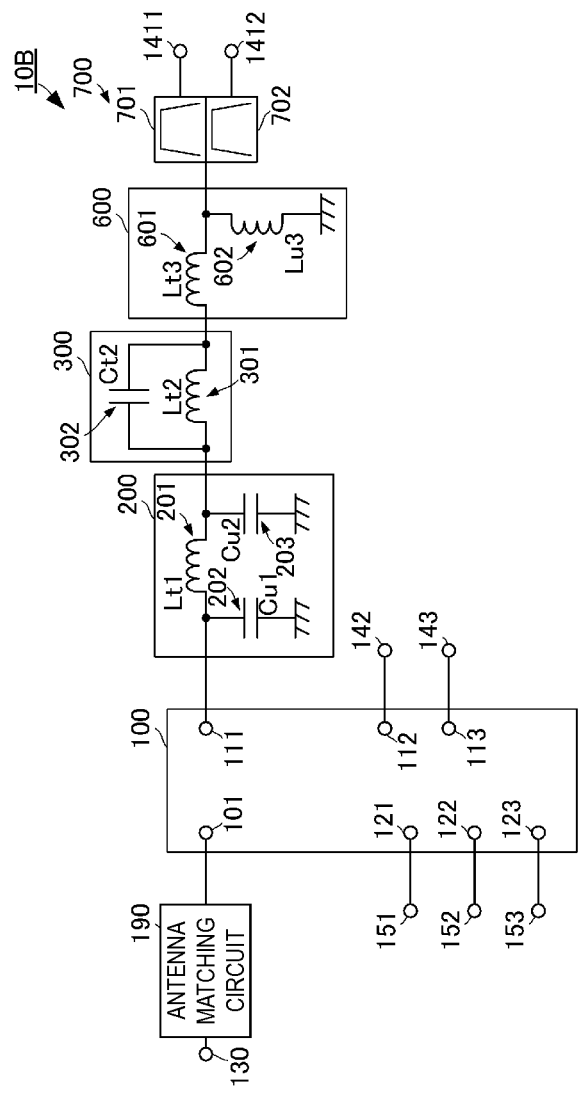
FIG. 9 is a circuit diagram of a high-frequency switch module according to a third preferred embodiment of the present invention.

Next, a high-frequency switch module according to a third preferred embodiment of the present invention will be described with reference to a drawing. FIG. 9 is a circuit diagram of the high-frequency switch module according to the third preferred embodiment of the present invention. A high-frequency switch module 10B of the present preferred embodiment is the high-frequency switch module 10A according to the second preferred embodiment to which the filter circuit 300 has been added. In other words, the high-frequency switch module 10B is a combination of the high-frequency switch module 10 according to the first preferred embodiment and the high-frequency switch module 10A according to the second preferred embodiment. Note that specific description of portions that are the same as those of the high-frequency switch module 10A according to the second preferred embodiment will be omitted.

The filter circuit 300 is connected between the phase adjustment circuit 200 and the matching circuit 600. This configuration also allows operations and effects similar to those described above to be realized. Further, in the present preferred embodiment, a distortion second harmonic signal that has passed through the filter circuit 300 and reached the duplexer 700 is reflected and returns to the switch IC 100. Hence, the attenuation of the amplitude of the distortion second harmonic signal returning to the common terminal 101 is further reduced. As a result, the cancelling-out effect is further enhanced.

Figure 10:
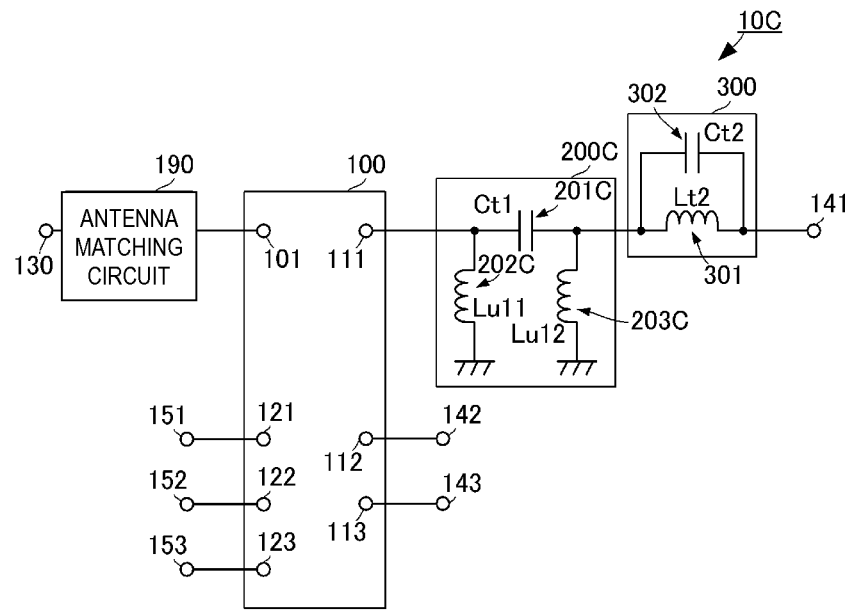
FIG. 10 is a circuit diagram of a high-frequency switch module according to a fourth preferred embodiment of the present invention.

Next, a high-frequency switch module according to a fourth preferred embodiment of the present invention will be described with reference to a drawing. FIG. 10 is a circuit diagram of the high-frequency switch module according to the fourth preferred embodiment of the present invention. A high-frequency switch module 10C of the present preferred embodiment is different from the high-frequency switch module 10 according to the first preferred embodiment in terms of a phase adjustment circuit 200C. The rest of the configuration is the same as that of the high-frequency switch module 10 according to the first preferred embodiment and, hence, only portions different from those of the high-frequency switch module 10 will be specifically described.

The phase adjustment circuit 200C includes a capacitor 201C and inductors 202C and 203C. The capacitor 201C is connected between the individual terminal 111 and the filter circuit 300. The individual terminal 111 side of the capacitor 201C is connected to the ground with the inductor 202C interposed therebetween. The filter circuit 300 side of the capacitor 201C is connected to the ground with an inductor 203C interposed therebetween. By appropriately setting a value (capacitance) Ct1 of the capacitor 201C, a value (inductance) Lu11 of the inductor 202C, and a value (inductance) Lu12 of the inductor 203C, the phase of a distortion second harmonic signal reaching, and reflected by, the filter circuit 300 is able to be adjusted and distortion harmonic signals output from the common terminal 101 are similarly cancelled out, as in the preferred embodiments described above.

Further, the phase adjustment circuit 200C preferably is a $\pi$-type high pass filter. Here, by adjusting the capacitance Ct1 of the capacitor 201C, the inductance Lu11 of the inductor 202C, and the inductance Lu12 of the inductor 203C, the high pass filter is set in such a manner that the frequency band of a high-frequency signal is located within the pass band and frequencies lower than this are located in the attenuation band.

With the configuration described above, the signal level of a second harmonic signal reflected by the filter circuit 300 and returning to the switch IC 100 is negligibly decreased while low-loss transmission of a high-frequency signal having the fundamental frequency is realized. Further, signals having frequencies lower than the fundamental frequency of a high-frequency signal are able to be cut off. Hence, a surge input from the antenna ANT is able to be cut off, and propagation of the surge to the filter circuit 300 is significantly reduced or prevented, thus realizing ESD protection of the filter circuit 300 and other devices connected to the external connection terminal 141. At this time, ESD protection of the switch IC 100 and additional ESD protection of the filter circuit 300 is achieved by providing, in the antenna matching circuit 190, the configuration of the inductor and capacitor enabling an ESD protection effect.

Figure 11:
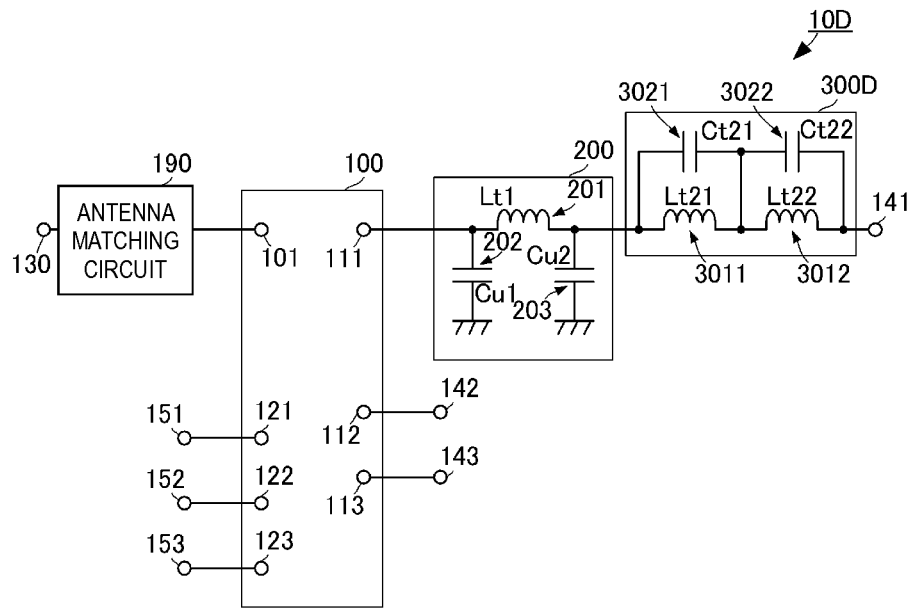
FIG. 11 is a circuit diagram of a high-frequency switch module according to a fifth preferred embodiment of the present invention.

Next, a high-frequency switch module according to a fifth preferred embodiment of the present invention will be described with reference to a drawing. FIG. 11 is a circuit diagram of the high-frequency switch module according to the fifth preferred embodiment of the present invention. A high-frequency switch module 10D of the present preferred embodiment is different from the high-frequency switch module 10 according to the first preferred embodiment in terms of a filter circuit 300D. The rest of the configuration is the same as that of the high-frequency switch module 10 according to the first preferred embodiment and, hence, only portions different from those of the high-frequency switch module 10 will be specifically described.

The filter circuit 300D is connected between the phase adjustment circuit 200 and the external connection terminal 141 and includes a two-stage LC parallel resonant circuit. The filter circuit 300D includes filter inductors 3011 and 3012 and filter capacitors 3021 and 3022. An LC parallel circuit including the filter inductor 3011 and the filter capacitor 3021 and an LC parallel circuit including the filter inductor 3012 and the filter capacitor 3022 are connected in this order from the phase adjustment circuit 200 side.

By appropriately setting an inductance Lt21 and a capacitance Ct21 of the LC parallel circuit including the filter inductor 3011 and the filter capacitor 3021, the attenuation pole frequency is set to the frequency of a second harmonic signal. By appropriately setting an inductance Lt22 and a capacitance Ct22 of the LC parallel circuit including the filter inductor 3012 and the filter capacitor 3022, the attenuation pole frequency is set to the frequency of a third harmonic signal. Note that the settings of these attenuation poles may be opposite to each other. That is, the attenuation pole frequency of the LC parallel circuit including the filter inductor 3011 and the filter capacitor 3021 may be set to the frequency of the third harmonic signal and the attenuation pole frequency of the LC parallel circuit including the filter inductor 3012 and the filter capacitor 3022 may be set to the frequency of the second harmonic signal.

This configuration also allows operations and effects similar to those in the preferred embodiments described above to be realized. Further, third and higher harmonic signals are able to be cut off, such that the harmonic distortion characteristics and out-of-band characteristics of the high-frequency switch module 10D are enhanced.

Figure 12:
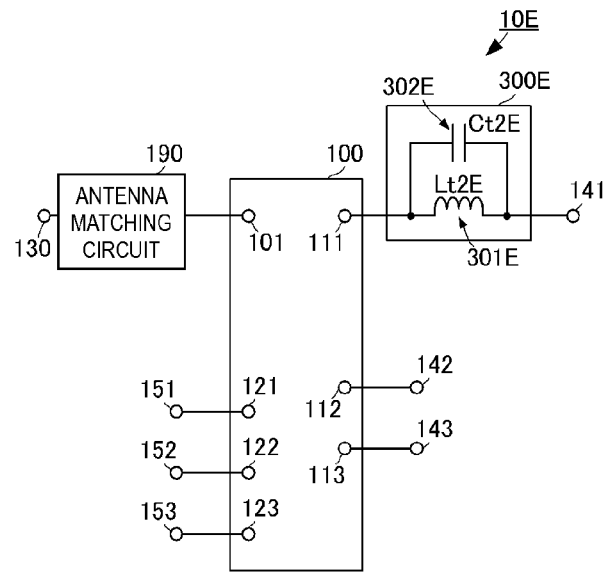
FIG. 12 is a circuit diagram of a high-frequency switch module according to a sixth preferred embodiment of the present invention.

Next, a high-frequency switch module according to a sixth preferred embodiment of the present invention will be described with reference to a drawing. FIG. 12 is a circuit diagram of the high-frequency switch module according to the sixth preferred embodiment. A high-frequency switch module 10E of the present preferred embodiment is different from the high-frequency switch module 10 according to the first preferred embodiment in that a filter circuit 300E also plays the role of the phase adjustment circuit 200, and the rest of the configuration is the same as that of the high-frequency switch module 10 according to the first preferred embodiment. Hence only portions different from those of the high-frequency switch module 10 will be specifically described.

The filter circuit 300E includes a filter inductor 301E and a filter capacitor 302E. The filter inductor 301E is connected between the individual terminal 111 and the external connection terminal 141. The filter capacitor 302E is connected in parallel with the filter inductor 301E.

In this configuration, by appropriately setting an inductance Lt2E of the filter inductor 301E and a capacitance Ct2E of the filter capacitor 302E, the phase shift function of the above-described phase adjustment circuit 200 for a second harmonic signal and the function of the filter circuit 300 are realized. With this configuration, a high-frequency switch module having a further reduced size is provided while realizing operations and effects similar to those of the preferred embodiments described above by omitting the phase adjustment circuit 200.

Figure 13:
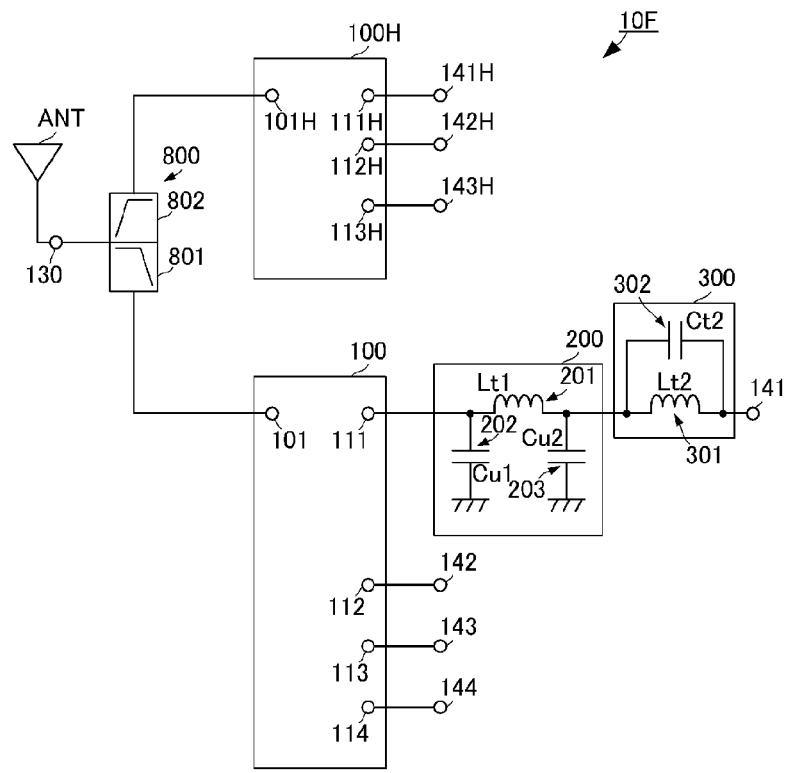
FIG. 13 is a circuit diagram of a high-frequency switch module according to a seventh preferred embodiment of the present invention.

Next, a high-frequency switch module according to a seventh preferred embodiment of the present invention will be described with reference to a drawing. FIG. 13 is a circuit diagram of the high-frequency switch module according to the seventh preferred embodiment. A high-frequency switch module 10F of the present preferred embodiment is realized by further adding a second switch IC 100H and a duplexer 800 to the high-frequency switch module 10 according to the first preferred embodiment. Hence, only portions different from those of the high-frequency switch module 10 will be specifically described. Note that in FIG. 13, the driving control terminals of the switch IC 100 and the second switch IC 100H are omitted. The switch IC 100 is provided for a low band and the second switch IC 100H is provided for a high band. Note that, for example, the low band represents a frequency band that is lower than 1.5 GHz and includes the 800 MHz band and 900 MHz band, and the high band represents a frequency band that is higher than or equal to 1.5 GHz and that includes the 1.5 GHz band, 1.8 GHz band, 1.9 GHz band, and the like.

The second switch IC 100H includes a common terminal 101H and individual terminals 111H, 112H, and 113H. The common terminal 101H is connected to one of the individual terminals 111H, 112H, and 113H.

The duplexer 800 includes a duplexer low pass filter 801 and a duplexer high pass filter 802. The duplexer low pass filter 801 is connected between the external connection terminal 130 and the common terminal 101 of the switch IC 100. The duplexer high pass filter 802 is connected between the external connection terminal 130 and the common terminal 101H of the second switch IC 100H.

The duplexer low pass filter 801 is set to allow a high-frequency signal in a plurality of band classes of the low band to pass therethrough, and attenuate a high-frequency signal in a plurality of band classes of the high band. The duplexer high pass filter 802 is set to allow a high-frequency signal in a plurality of band classes of the high band to pass therethrough, and attenuate a high-frequency signal in a plurality of band classes of the low band.

In this configuration, high-frequency signals in the band class of the low band are transmitted and received through the switch IC 100, and high-frequency signals in the band class of the high band are transmitted and received through the second switch IC 100H. In this case, the frequency of a second harmonic signal generated by the switch IC 100 is close to or partially superposed with the frequency of the band class of the high band, thus resulting in noise.

However, since the phase adjustment circuit 200 and the filter circuit 300 are connected to the switch IC 100, the second harmonic signal is negligibly output from the common terminal 101 of the switch IC 100. Hence, the second harmonic signal of the switch IC 100 is not input to the second switch IC 100H. As a result, the signal to noise ratio during reception of the band class of the high band is increased, such that a high-frequency switch module with excellent transmission and reception characteristics is realized.

Further, even in the case where a high-frequency signal in the band class of the low band and a high-frequency signal in the band class of the high band are simultaneously transmitted or received due to carrier aggregation, the signal to noise ratio in reception of a high-frequency signal in the band class of the high band is maintained high. As a result, a high-frequency switch module, conforming to carrier aggregation specifications, that enhances the reception characteristics for a high-frequency signal of the band class of the high band and that has excellent transmission and reception characteristics is realized.

Figure 14:
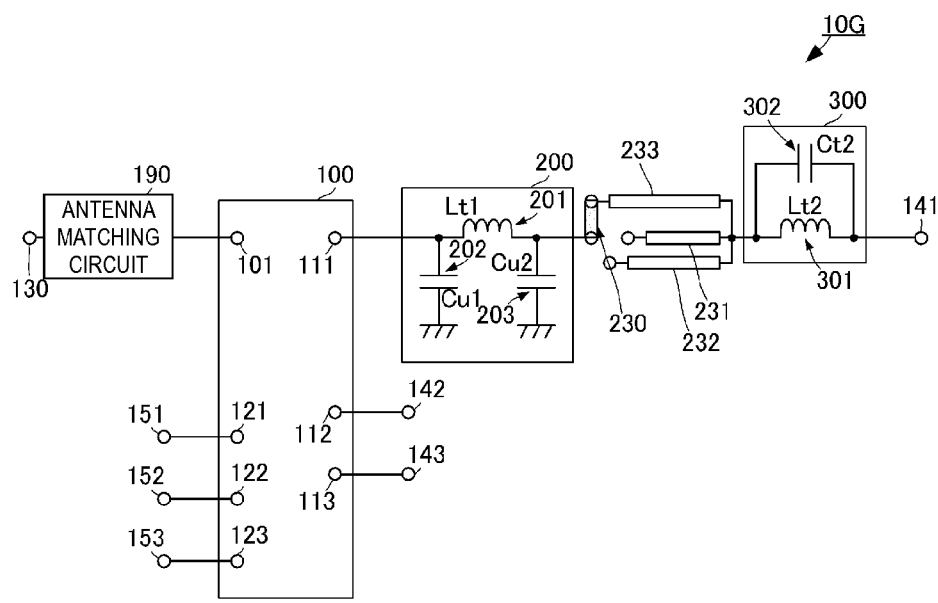
FIG. 14 is a circuit diagram of a high-frequency switch module according to an eighth preferred embodiment of the present invention.

Next, a high-frequency switch module according to an eighth preferred embodiment of the present invention will be described with reference to a drawing. FIG. 14 is a circuit diagram of the high-frequency switch module according to the eighth preferred embodiment of the present invention. A high-frequency switch module 10G of the present preferred embodiment is realized by adding a plurality of line conductors 231, 232, and 233 and a selection member 230 to the high-frequency switch module 10 according to the first preferred embodiment. The rest of the configuration is the same as that of the high-frequency switch module 10 according to the first preferred embodiment. Hence only portions different from those of the high-frequency switch module 10 will be specifically described.

The plurality of line conductors 231, 232, and 233 have different lengths, and first ends are connected to the filter circuit 300. The selection member 230 is preferably, for example, a zero-ohm resistor and is arranged in such a manner that one of second ends of the plurality of line conductors 231, 232, and 233 is connected to the phase adjustment circuit 200.

With this configuration, the line conductors which are not connected by the selection member 230 define and function as open stubs. Hence, versatile settings of the amount of phase adjustment of a second harmonic signal is realized by combinations of the selection member 230 and the line conductors 231, 232, and 233.

Figure 15:
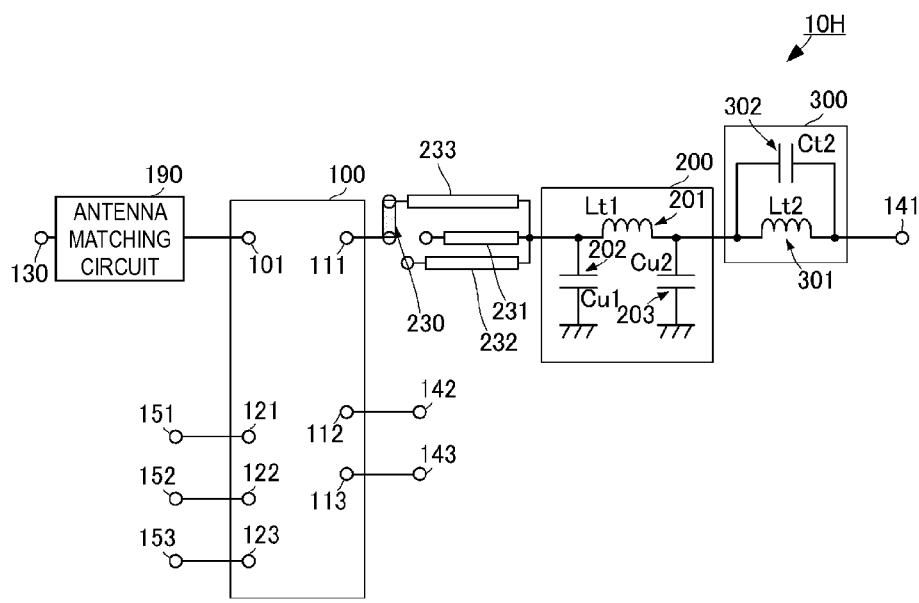
FIG. 15 is a circuit diagram of a high-frequency switch module according to a ninth preferred embodiment of the present invention.

Next, a high-frequency switch module according to a ninth preferred embodiment of the present invention will be described with reference to a drawing. FIG. 15 is a circuit diagram of the high-frequency switch module according to the ninth preferred embodiment of the present invention. A high-frequency switch module 10H of the present preferred embodiment is different from the high-frequency switch module 10G according to the eighth preferred embodiment in terms of the arrangement positions of the plurality of line conductors 231, 232, and 233 and the selection member 230, and the rest of the configuration is the same as that of the high-frequency switch module 10G according to the eighth preferred embodiment. Hence only portions different from those of the high-frequency switch module 10G will be specifically described.

First ends of the plurality of line conductors 231, 232, and 233 are connected to the phase adjustment circuit 200. The selection member 230 is arranged in such a manner that one of second ends of the plurality of line conductors 231, 232, and 233 is connected to the individual terminal 111 of the switch IC 100.

With this configuration, the line conductors not connected to the selection member 230 define and function as open stubs. Hence, further versatile settings of the amount of phase adjustment of a second harmonic signal are realized by combinations of the selection member 230 and the line conductors 231, 232, and 233.

Note that in the preferred embodiments described above, the phase of the distortion second harmonic signal that is output from an individual terminal and returned to the common terminal preferably is different from the phase of the distortion second harmonic signal output from the common terminal by 180°, for example. However, it is only required that the phase difference be from 90° to 270°. This allows the distortion second harmonic signal output from the common terminal to be significantly reduced.

Further, an example has been shown in which the phase adjustment circuit preferably is a π-type circuit, in the preferred embodiments described above; however, the phase adjustment circuit may be realized by an L-type circuit or a T-type circuit as long as an inductor and a capacitor are used.

Further, an example has been shown in which the phase adjustment function for a second harmonic signal is preferably provided at a single individual terminal, in the preferred embodiments described above; however, in the case where there are a plurality of external connection terminals to which high-power high-frequency signals (for example, transmission signals) are input, it is only required that the phase adjustment function for a second harmonic signal be provided between each of these external connection terminals and a corresponding individual terminal of the switch IC.

Further, the configurations of the preferred embodiments described above may be appropriately combined, if necessary.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency switch module comprising:
a common terminal;
a plurality of individual terminals;
a switch IC that connects one of the plurality of individual terminals through switching to the common terminal through on/off control of a semiconductor switch device such that harmonic signals are output from the common terminal and individual terminals of the switch IC;
a filter circuit that is connected between a first individual terminal of the plurality of individual terminals and a first external connection terminal to which a high-frequency signal is input from outside and that attenuates a harmonic component of the high-frequency signal; and
a phase adjustment circuit that is connected between the filter circuit and the first individual terminal and that includes an inductor and a capacitor; wherein
in the phase adjustment circuit, values of the inductor and the capacitor are such that an amplitude of a harmonic signal output from the common terminal and an amplitude of a harmonic signal that is output from the first individual terminal and that is reflected at the filter circuit and returns to the first individual terminal cancel each other out; and
the phase adjustment circuit is a low pass filter having a pass band that includes a frequency band of the harmonic signal from the first individual terminal.

2. The high-frequency switch module according to claim 1, wherein the values of the inductor and the capacitor are such that a phase difference between the harmonic signal from the common terminal and the harmonic signal from the first individual terminal is between 90° and 270°.

3. The high-frequency switch module according to claim 2, wherein the values of the inductor and the capacitor are such that the phase difference between the harmonic signal from the common terminal and the harmonic signal from the first individual terminal is 180°.

4. The high-frequency switch module according to claim 1, wherein the filter circuit is a notch filter in which a frequency of the harmonic signal is equal or substantially equal to an attenuation pole frequency.

5. The high-frequency switch module according to claim 4, wherein
the filter circuit includes an LC parallel resonant circuit in which a filter capacitor and a filter inductor are connected in parallel; and
the LC parallel resonant circuit is connected between the first external connection terminal and the phase adjustment circuit.

6. The high-frequency switch module according to claim 4, wherein
the filter circuit includes an LC series resonant circuit in which a filter capacitor and a filter inductor are connected in series; and
the LC series resonant circuit is connected between a ground and a connection line between the first external connection terminal and the phase adjustment circuit.

7. The high-frequency switch module according to claim 1, wherein the filter circuit is a band pass filter having a pass band that includes a frequency band of the high-frequency signal.

8. The high-frequency switch module according to claim 7, wherein the band pass filter is a filter that defines a duplexer.

9. The high-frequency switch module according to claim 8, wherein the duplexer includes a first band pass filter and a second band pass filter.

10. The high-frequency switch module according to claim 8, wherein the duplexer is connected to the phase adjustment circuit with a matching circuit.

11. The high-frequency switch module according to claim 8, wherein the phase adjustment circuit further includes another capacitor.

12. The high-frequency switch module according to claim 1, wherein
the switch IC is configured for use in a low band; and
the switch module includes:
a second switch IC for a high band; and
an antenna side-duplexer that includes a connection terminal for connection to an antenna, a low-band-side terminal connected to the common terminal of the switch IC, and a high-band-side terminal connected to a common terminal of the second switch IC, and that separates a high-frequency signal in the low band and a high-frequency signal in the high band; wherein
a high-frequency signal input to the first individual terminal and a second high-frequency signal transmitted through the second switch circuit are at least temporarily communicated at the same time.

13. The high-frequency switch module according to claim 1, further comprising:
a plurality of line conductors that are connected to the filter circuit and that have different lengths; and
a selection member that selectively connects one of the plurality of line conductors to the phase adjustment circuit; wherein
the plurality of line conductors and the selection member are connected between the filter circuit and the phase adjustment circuit.

14. The high-frequency switch module according to claim 1, further comprising:
a plurality of line conductors that are connected to the phase adjustment circuit and that have different lengths; and
a selection member that selectively connects one of the plurality of line conductors to the first individual terminal; wherein
the plurality of line conductors and the selection member are connected between the phase adjustment circuit and the first individual terminal.

15. The high-frequency switch module according to claim 1, wherein the high-frequency switch module includes a multilayer body including a plurality of dielectric layers including conductor patterns provided thereon;

the inductor of the phase adjustment circuit is a surface mount inductor device mounted on the multilayer body; and the capacitor of the phase adjustment circuit is a surface mount capacitor device mounted on the multilayer body.

16. The high-frequency switch module according to claim 15, wherein an inductor of the filter circuit is a surface mount inductor device mounted on the multilayer body; and a capacitor of the filter circuit is a surface mount capacitor device mounted on the multilayer body.

* * * * *